(12) United States Patent
Abramov et al.

(10) Patent No.: US 6,365,920 B1
(45) Date of Patent: Apr. 2, 2002

(54) LUMINESCENT DIODE

(75) Inventors: Vladimir Semyonovich Abramov; Nikolai Mikhailovich Belenkov; Sergei Dmitrievich Denisov; Nikolai Valentinovich Scherbakov; Lev Alexeevich Uvarov, all of Moscow (RU)

(73) Assignee: Korvet Lights, Moscow (RU)

( * ) Notice: Subject to any disclaimer, the term of this patent is extended or adjusted under 35 U.S.C. 154(b) by 0 days.

(21) Appl. No.: 09/381,392

(22) PCT Filed: Mar. 18, 1997

(86) PCT No.: PCT/RU97/00070

§ 371 Date: Sep. 17, 1999

§ 102(e) Date: Sep. 17, 1999

(87) PCT Pub. No.: WO98/42031

PCT Pub. Date: Sep. 24, 1998

(51) Int. Cl.[7] .......................... H01L 27/15; H01L 33/00; H01L 21/44

(52) U.S. Cl. .............. 257/81; 257/82; 257/95; 257/99; 257/98; 257/88; 438/116; 438/127; 438/126; 438/125; 438/106

(58) Field of Search ................ 257/81, 82, 88, 257/89, 95, 98, 99, 100; 438/116, 125, 126, 127, 106

(56) References Cited

U.S. PATENT DOCUMENTS

| | | | |
|---|---|---|---|
| 3,774,086 A | * 11/1973 | Vincent, Jr. | 317/235 |
| 3,939,488 A | * 2/1976 | Wakashima et al. | 357/72 |
| 4,159,648 A | * 7/1979 | Prosky | 73/362 |
| 4,387,385 A | * 6/1983 | Thillays et al. | 357/17 |
| 4,907,044 A | 3/1990 | Schellhorn et al. | |
| 5,841,177 A | * 11/1998 | Komoto et al. | 257/431 |
| 5,985,696 A | * 11/1999 | Brunner et al. | 438/116 |

FOREIGN PATENT DOCUMENTS

| | | |
|---|---|---|
| DE | 20 62 309 | 1/1975 |
| DE | 35 32 821 C2 | 12/1992 |
| WO | PCT/US94/10781 | 9/1994 |

OTHER PUBLICATIONS

Hewlett Packard *Optoelectronics Designer's Catalog*, "T–1 3/4 (5 mm) High Performance TS AlGaAs Red LED Lamps," Technical Data.

(List continued on next page.)

*Primary Examiner*—Eddie Lee
*Assistant Examiner*—Joseph Nguyen
(74) *Attorney, Agent, or Firm*—Lackenbach Siegel Marzullo Aronson & Greenspan, P.C.

(57) ABSTRACT

The present invention relates to electronics and especially to semiconductors. It is an improved embodiment of a luminescent diode, intended to increase the radiated power thereof. The device concerned is realized in the form of a securing device comprising a back plate and binding screws. The luminescent diode cover resembles a polyspherical lens with a cylindrical base having guide rods relative to the positionning openings provided in the back plate. The thickness of the back plate is equal to or larger than four thicknesses of light transmitter crystal. The crystal is fastened on the flat portion of the conical reflecting surface formed on the back plate. The depth of the conical surface exceeds two thicknesses of light transmitter crystal, and the resting area of the crystal has a diameter larger than the diagonal of its lower limit, but does not exceed the value of said diagonal by more than one and a half. The volume between the cylindrical base of the cover and the upper surface of the back plate is filled with a sealing polymer (compound), and the connection point between the conductor and the isolated binding post is covered with a layer of electroconductive glue. Luminescent diodes such as disclosed are intended to indicate the working conditions of various apparatuses and can also be used as fill-in lighting instead of incandescent lamps.

14 Claims, 1 Drawing Sheet

OTHER PUBLICATIONS

S. Zi, *Fizika poluprovodnikovykh priborov*, Moscow: Mir, 1984 (trans. into Russian of S. M. Sze, *Physics of Semiconductor Devices*; New York: John Wiley & Sons, 1981).

A. Berg, P. Din, *Svetodiody*, Moscow: Mir, 1979 (trans. of A. A. Bergh and P. J. Dean, *Light–emitting diodes*, Oxford: Clarendon Press, 1976), pp. 288–289, 466–467.

AEG–Telefunken, *Selection Guide, Optoelectronic Devices*, Edition 1.82, Heilbronn: 1982.

\* cited by examiner

LUMINESCENT DIODE

BACKGROUND OF THE INVENTION

1. Field of the Invention.

The invention falls within the realms of electronic engineering specifically of semiconductor devices, namely, light-emitting diodes, and finds its application in semiconductor engineering in the development and manufacture of light-emitting diodes used in power, railway and automobile transport, ferrous metallurgy, chemical, heavy and other industries.

2. Description of the Prior Art.

Light-emitting diodes are widely used in signaling information as to modes of operation of various devices for the illumination of screens, in the manufacture of information sources such as information panels, traffic lights, traveling lines, additional signals of braking in automobiles, etc. See German Patent No. 20 62 209, issued Jan. 9, 1975; German Patent No. 35 32 821 issued Dec. 12, 1992; U.S. Pat. No. 4,907,044 issued Mar. 6, 1990; International PCT Patent Application No. PCT/US94/10781 filed Apr. 6, 1995; and Svetodiody [Light-Emitting Diodes], by A. Berg and P. Din (1979).

The use of light-emitting diodes instead of incandescent lamps considerably increases reliability and reduces the power consumption by the equipment used. Because of this increase in use, there are now required in many cases light-emitting diodes that have a wide range of colors and shades of light flow, and that are of various sizes and varying uniformity as to the luminous spot and different emission powers (luminous intensities).

The most important parameter in working with light-emitting diodes is the emission power which depends mostly on the amount of forward flow of electrical current and the thermal resistance value of the holder on which a crystal of light emitter is installed.

Already known to the prior art is a light-emitting diode with a red color luminescence of HLMP-C100 type in which the crystal of the light-emitter is fixed onto a holder connected to one of the electrical outlets and located in a plastic monolithic casing. This casing consists of a hemispheric lens, 5 mm in diameter, which concentrates the emission, and a cylindrical base. See *Optoelectronics Designers's Catalog*, Hewlett Packard (1993), pp. 3–44. With the forward current being equal to 20 mA, the minimum value of light intensity is 0.29 Cd at an angle of vision of ±±30° at half power of emission. The value of thermal resistance of the casing is 210° C./W. The drawback of such a light-emitting diode is its low light intensity. This low intensity is caused by the fact that it is impossible to increase the value of forward current strength via a unit because of considerable thermal resistance from the casing and overheating of the crystal of the light emitter due to the fact that the released heat is removed by means of a metallic outlet only. Here a disturbance of the linearity of the lumen-ampere characteristic is observed. This inhibits the rise of luminous intensity that accompanies the increases in the level of forward current.

Also known is a light-emitting diode having infrared radiation of the CQX 19 type, in which a crystal of a light-emitter is installed on the holder of the casing TO-39. See *A Selection Guide to Optoelectronic Devices*, Catalog AEG Telefunken (1982), p. 11. A hemispheric lens 8 mm in diameter is formed on this holder. When forward electrical current is equal to 250 mA, the power for releasing an emission constitutes 20 mW with an angle of vision of –±±20° at half power of emission. The value of the thermal resistance is equal to 250 to 300° C./W, which is a considerable value and does not permit the emission power to be raised by increasing the level of the forward current.

An effective red color light-emitting diode of the I N 6092 type is the most suitable for the light-emitting diode, according to its technical principle. See S. M. Zee, *Fizika poluprovodnikovykh priborov* (vol. 2, 2d ed., M. Mir: 1984, p. 289, FIG. 16a. This light-emitting diode, taken as a prototype, contains a metallic glass holder with electrical outlets, a crystal of a light-emitter with ohmic contacts that are installed on the holder by means of a current-transmitting glue and connected through the conductor with the appropriate outlet, and also a metallic cover with a lens that concentrates the emission produced by the crystal.

The allowable forward electrical current through this device is 35 mA, the thermal resistance is –425° C./W, the angle of vision is ±±18° at half emission power, while the standard value of emission power is 5 mcd when the forward current is 20 mA.

It is obvious that the drawback of this light-emitting diode is its low emission power and the high value of thermal resistance that is caused by the weak dissipation of heat produced by the crystal of light-emitter only through the outlet on which this crystal is installed. This limitation of the dissipation power value does not permit the flow of high forward current due to a disturbance of the linearity of the lumen-ampere characteristic of the light-emitting diode.

SUMMARY OF THE INVENTION

The set task and aim of this invention is to increase the emission power of the diode, thus making it possible to vary the angle of vision of the device.

The invention also has as its goals increased accuracy of the coaxal hemispheric lens and the crystal of the light emitter, and an increased ability to work with light-emitting diodes at an ambient temperature of less than 60° C.

The set task is solved through the development of a light-emitting diode in accordance with the invention in which a cover with a hemispheric lens on a cylindrical base having a thickness (the height of the cylinder) not exceeding the size of the hemispheric lens radius. Pins are disposed on the lower face of the cylindrical base. These pins are located in accordance with the positions of the holes in a holder-substrate. The holder-substrate has a thickness equal to or exceeding four thicknesses of the crystal of the light emitter. See X. The holder-substrate contains a mounting seat for a crystal of the light-emitter in the form of a recess with a flat bottom and a lateral surface in the form of a body of revolution, chiefly truncated conical surface, reflecting the emissions. It also has a flat bottom on which the crystal of light emitter is installed—with the flat mounting seat crystal of the light-emitter in recess. Here, the depth of the mounting seat of the crystal of the light-emitter exceeds two thicknesses of the indicated crystal of the light-emitter, whereas the diameter of the flat mounting seat in the recess exceeds the size of the diameter of the lower face of the crystal of the light-emitter, but is less than one and a half the values of this size. In addition, the space between the lower face of the cylindrical base and the upper surface of the holder-substrate in the light-emitting diode is filled with polymeric sealing compound. At the junction of the conductor and the isolated connecting outlet, a layer of current-transmitting glue is applied.

DETAILED DESCRIPTION OF THE INVENTION

Figure 1:
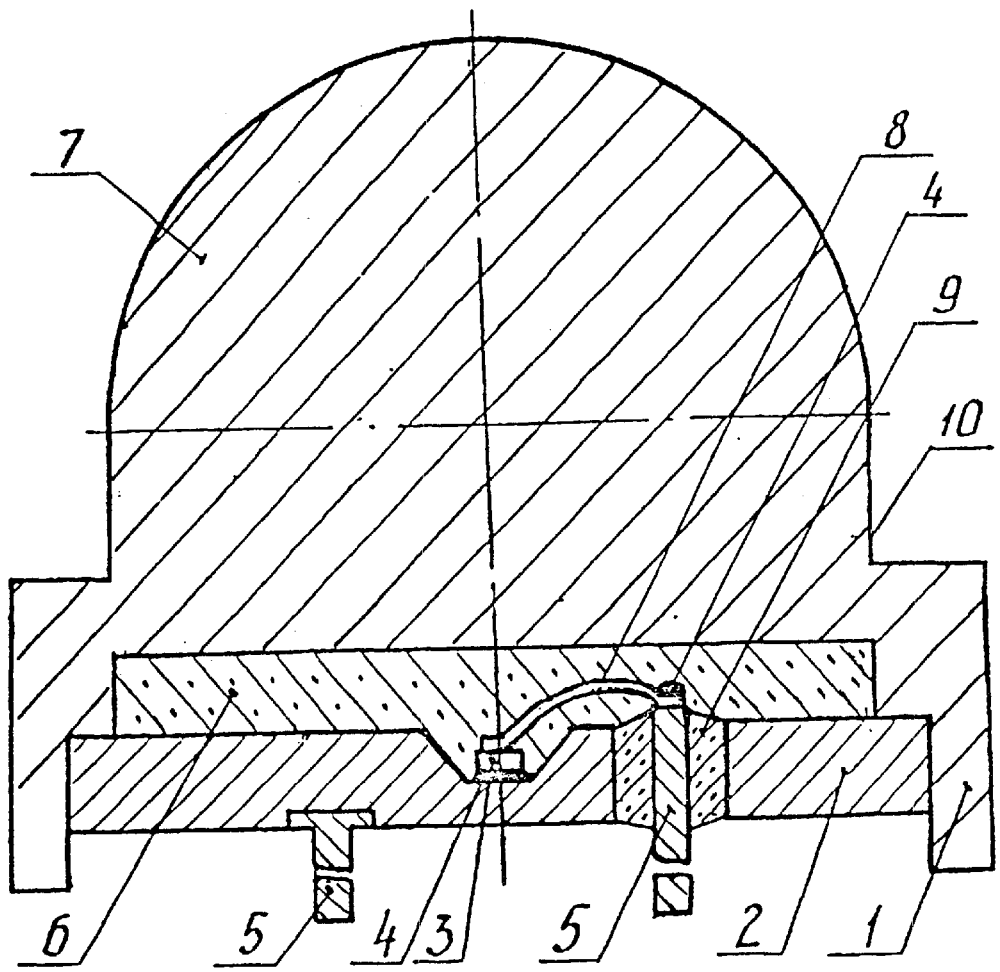
FIG. 1 shows a light-emitting diode, in section and on an enlarged scale, in accordance with the present invention.
Figure 2:
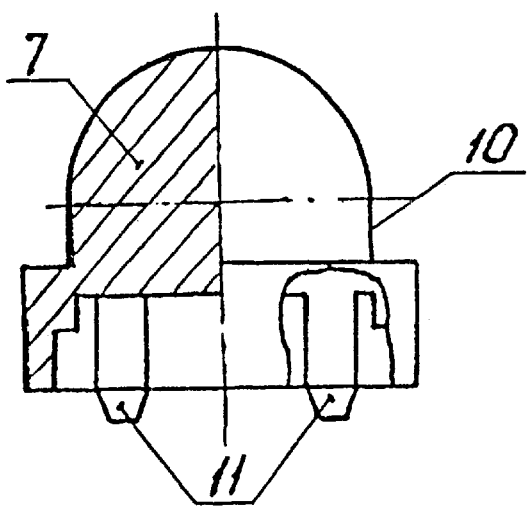
FIG. 2 shows the cover of the light-emitting diode shown in FIG. 1, having a hemispheric lens with a cylindrical base, guide pins and position holes.

The proposed light-emitting diode functions as follows. When the electrical voltage that ensures the flow of forward current through the crystal of the light emitter receiver (3) is supplied to the connection outlets (5) of a holder-substrate (2), the crystal of the light emitter (3) begins to emit light. The emission from the surface of the crystal of the light emitter (3) and from its lateral faces after reflecting by the conical surface recess (14) falls on a layer of polymeric sealing compound (6), the cylindrical base (10) and is focused by the hemispheric lens (7).

The availability of a polymeric sealing compound (6) and also the fact that the cylindrical base (10) has a thickness that does not exceed the radius of the hemispheric lens (7) ensures the reduction of emission intensity losses and also provides the required emission directionality pattern. Further, the polymeric sealing compound (6) provides a waterproof crystal of the light emitter, a point of conductor (8) connection to the crystal of the light-emitter and also a point of connection of this conductor (8) to the insulated connection outlet (5), which is insulated from the holder-substrate base (2) by the glass insulator (9). The layer of current-transmitting glue (4) is applied to the point of connection of the conductor (8) to the insulated connection outlet (5) and increases the reliability of this connection and also that of the light-emitting diode as a whole.

Constructing the light-emitting diode with a polymeric sealing compound (6) made on a basis of a metallic holder-substrate (2) with a reflecting conical surface recess (14), permits the use of the lateral luminescence of the light-emitter crystal (3), and an increase in emission intensity (2–3 times).

The depth of the reflecting truncated conical surface recess, in which a crystal of the light emitter (3) is installed, along with the diameter of the mounting seat of the crystal of the light emitter (3), enable the practically full concentration of the emission along the optical axis of the crystal of the light emitter (3). Here, the depth of the reflecting truncated conical surface exceeds two thicknesses of the light emitter (3), and the diameter of the mounting seat for the crystal of the light emitter (3) exceeds the size of the diameter of its lower face, but comprises less than one and a half times the crystal diameter.

A recess (14)—a deepened mounting seat—for the crystal of the light emitter (3) in combination with guide pins (11) facilitates the alignment crystal of the light emitter (3) along the optical axis of the light-emitting diode.

The distance from the holder-substrate (2) to the lower face of cylindrical base (12) may be changed by movement of the holder-substrate (2) along the guide pins (11). It permits the regulation of the emission intensity at the expense of changing the angle of vision at half emission intensity in the range from ±±4 to ±±50.

A holder-substrate (2) having a thickness equal to or exceeding four thicknesses of the crystal of the light emitter (3), ensures an effective dissipation of consumed power from the lower face of the holder-substrate (2).

Crystals of the light emitter (3) with red, orange, yellow, green, blue and dark blue colors of luminescence may be used in a monochromatic version of the light-emitting diode.

Color saturation and adequate perception of the information may be obtained by additionally painting of the cover with an appropriate color. This paint is made by adding a pigment or dispersing agent (for example, crushed optical quartz) therein. The use of a dispersing agent increases the size of the luminous spot, which in turn improves the perception of luminescence without destroying the physical-chemical properties of the cover material.

The increase of the emission intensity or the required color of the luminescence of the device is achieved by reflecting the conical or other concentrating surface on the holder-substrate (2) with the formation of an appropriate number of outlets and the installation of several crystals of the light emitters of one or various colors of luminescence onto the mounting seats.

The holder-substrate (2) may also be a dielectric covered by a copper-nickel layer on one or two sides. In this case, on the basis of a copper-nickel layer, a printed circuit may be formed on the upper face of the substrate. This circuit is connected with the appropriate outlets (5) and ensures the installation of the light emitter crystals (3) on their mounting seats and the distribution of the conductors over the outlets (5). The printed circuit is executed in such a way that a copper-nickel layer occupies the maximum area of the substrate except for spacings that ensure the integrity of the printed circuit. It increases the reflection of the emission of the light emitter crystals (3) and raises the emission power.

The availability of copper-nickel layer on the back side of the holder-substrate (2), except for connection outlets (5), ensures the lowering of thermal resistance and thereby reduces the possibility of overheating of the light emitter (3).

The construction of this light-emitting diode, made in accordance with this invention contains a metallic holder-substrate of steel 1 mm thick, coated with a nickel layer and connected to nickel outlets 0.55 mm in diameter. The reflecting conical surface recess has a depth recess of the mounting seat of the crystal of the light emitter of 0.5 mm, the diameter of the recess on the holder-substrate surface is equal to 1.6 mm, the diameter of the flat mounting seat of the crystal of the light emitter in the recess is 0.6 mm. The cover is cast in plastic-polycarbonate of the "Lexan" type. The radius of the hemispheric lens is equal to 5 mm, the thickness of the cylindrical base is 3 mm, the distance between the holder-substrate and the cylindrical base was varied within the limits of 1–3 mm. A sealing (polymeric) compound of a 159–322 make was used.

A crystal-emitting red light with wave 662 nm in length served as a crystal of the light emitter. To install the crystal of the light emitter and to coat the junction of the conductor and the isolated connecting outlet based on silver, a current-transmitting glue of a TOK-2 type was applied.

The described construction of the light-emitting diode ensures that thermal resistance is 170° C./W and increases the forward current flowing through the light-emitting diode up to 80 mA without losses of linearity of the lux-ampere characteristic. This makes it possible to obtain a luminous intensity of more than 1.5 Cd and an emission power of more than 25 mW at current 20 and 100 mA, respectively.

In conclusion it should be noted that we found these technical decisions—directed towards the increase of emission power of light-emitting diodes by the indicated means—neither in the scientific-technical literature nor in the patent information sources. A comparison of this invention with a selected prototype, as well as with the other technical strategies in a given field of techniques, did not reveal technical decisions similar to the distinctive features of the subject invention.

What is claimed is:

1. A light-emitting diode comprising a heat-conductive holder-substrate having a reflective frusto-conical recess in one surface gradually decreasing below said one surface to define a flat mounting seat; a light-emitting crystal having a predetermined diameter and thickness for emitting light from axial and lateral or peripheral surfaces and being mechanically supported on and electrically connected to said mounting seat of said holder-substrate; at least one connection outlet extending through and being insulated from said holder-substrate and having one end proximate to said light-emitting crystal; a conductor electrically connecting said one end of said connection outlet to said crystal; a cover formed of a hemispheric lens spaced from said surface and a cylindrical base intermediate said hold substrate and said hemispheric lens to define an optical axis; said cover having a lower face; guide means for aligning said cover and said light-emitting crystal along said optical axis, a space being formed between said lower face of said cover and the opposing surface of said holder-substrate and being substantially coextensive with said cover in a plane substantially normal to said optical axis; and a transparent polymeric sealing compound filling said space and said frusto-conical recess.

2. A light-emitting diode as defined in claim 1, wherein a holder-substrate contains a mounting seat for a crystal of a light emitter in the form of a recess with a flat bottom and a lateral surface in the form of a body of revolution, chiefly truncated conical surface, reflecting emission.

3. A light-emitting diode as defined in claim 2 wherein a diameter of the flat mounting seat exceeds the size of the diagonal of a lower face of the light-emitting crystal but is not more than 1.5 the size of said indicated diagonal.

4. A light-emitting diode as defined in claim 2, wherein a substrate has a thickness equal to four and more thicknesses of light-emitter crystal.

5. A light-emitting diode as defined in claim 2, wherein a thickness of a cylindrical base of the lens does not exceed the lens radius.

6. A light-emitting diode as defined in claim 5, wherein the space between a cylindrical base of the cover and the upper surface of the substrate is filled with a polymeric sealing compound.

7. A light-emitting diode as defined in claim 1, wherein a holder-substrate has a thickness equal to four and more thicknesses of light-emitter crystal.

8. A light-emitting diode as defined in claim 2, wherein the space between a cylindrical base of the cover and the upper surface of the substrate is filled with a polymeric sealing compound.

9. A light-emitting diode as defined in claim 1, wherein a diameter of the flat mounting seat exceeds the size of the diagonal of a lower face of the light-emitting crystal but is not more than 1.5 the size of said indicated diagonal.

10. A light-emitting diode as defined in claim 1, wherein the space between a cylindrical base of the cover and the upper surface of the substrate is filled with a polymeric sealing compound.

11. A light-emitting diode comprising a heat-conductive holder-substrate having a reflective frusto-conical recess in one surface with a flat bottom and a lateral surface in the form of a body of revolution to define a mounting seat; a light-emitting crystal having a predetermined diameter and thickness for emiting light from axial and lateral or peripheral surfaces and being mechanically supported on and electrically connected to said mounting seat of said holder-substrate; at least one connection outlet extending through and being insulated from said holder-substrate and having one end proximate to said light-emitting crystal; a conductor electrically connecting said one end of said connection outlet to said crystal; a cover formed of a hemispheric lens spaced from said surface and a cylindrical base intermediate said hold substrate and said hemispheric lens to define an optical axis; said cover having a lower face; at least one guide pin projecting from said lower face, said holder-substrate having at least one position hole for receiving said at least one pin for aligning said holder substrate and said cover during assembly, said recess having a dimension along said optical axis equal to at least twice said predetermined thickness and said mounting seat having a diameter greater than said light-emitting crystal diameter but less than 1.5 times said crystal diameter to at least double the emission intensity for a predetermined current or power input to the device.

12. A light-emitting diode as defined in claim 11, wherein a diameter of the flat mounting seat exceeds the size of the diagonal of a lower face of the light-emitting crystal but is not more than 1.5 the size of said indicated diagonal.

13. A light-emitting diode comprising a heat-conductive holder-substrate having a reflective frusto-conical recess in one surface with a flat bottom and a lateral surface in the form of a body of revolution to define a mounting seat; a light-emitting crystal having a predetermined thickness and being mechanically supported on and electrically connected to said mounting seat of said holder-substrate; at least one connection outlet extending through and being insulated from said holder-substrate and having one end proximate to said light-emitting crystal; a conductor electrically connecting said one end of said connection outlet to said crystal; a cover formed of a hemispheric lens spaced from said surface and a cylindrical base intermediate said hold substrate and said hemispheric lens to define an optical axis; said cover having a lower face; at least one guide pin projecting from said lower face, said holder-substrate having at least one position hole for receiving said at least one pin for aligning said holder substrate and said cover during assembly, said cover and substrate being movable relative to each other along said optical axis to regulate the light emission intensity from said light-emitting crystal for changes in the optical angle of vision in the range of approximately ±±4° to ±±50° about said optical axis at half emissive power.

14. A light-emitting diode as defined n claim 13, wherein the space between a cylindrical base of the cover and the upper surface of the substrate is filled with a polymeric sealing compound.

* * * * *